United States Patent

Orso et al.

[11] Patent Number: 6,018,686
[45] Date of Patent: Jan. 25, 2000

[54] ELECTRICALLY IMPRINTING A SEMICONDUCTOR DIE WITH IDENTIFYING INFORMATION

[75] Inventors: William R. Orso, Milpitas; Craig M. Nishizaki, San Mateo, both of Calif.

[73] Assignee: Cypress Semiconductor Corp., San Jose, Calif.

[21] Appl. No.: 08/962,519

[22] Filed: Oct. 31, 1997

[51] Int. Cl.$^7$ ............................... G06F 19/00; G06F 7/66
[52] U.S. Cl. ...................... 700/121; 700/94; 700/113; 700/117
[58] Field of Search .................. 364/468.28, 468.24, 364/468.01, 488, 490, 489, 712; 700/121, 117, 94, 113

[56] References Cited

U.S. PATENT DOCUMENTS

| | | | |
|---|---|---|---|
| 4,510,673 | 4/1985 | Shils et al. | 438/15 |
| 4,931,997 | 6/1990 | Mitsuishi et al. | 365/218 |
| 5,084,843 | 1/1992 | Mitsuishi et al. | 365/218 |
| 5,256,578 | 10/1993 | Corley et al. | 438/17 |
| 5,360,747 | 11/1994 | Larson et al. | 438/10 |
| 5,406,566 | 4/1995 | Obara | 371/21.2 |
| 5,457,408 | 10/1995 | Leung | 326/38 |
| 5,642,307 | 6/1997 | Jernigan | 365/103 |
| 5,664,093 | 9/1997 | Barnett et al. | 714/31 |
| 5,867,714 | 2/1999 | Todd et al. | 395/712 |
| 5,892,683 | 4/1999 | Sung | 395/500.48 |
| 5,905,887 | 5/1999 | Wu et al. | 713/500 |

OTHER PUBLICATIONS

U.S. Application Serial No. 08/984,722.
U.S. Application Serial No. 08/984,814.
U.S. Application Serial No. 08/975,343.

*Primary Examiner*—William Grant
*Assistant Examiner*—McDieunel Marc
*Attorney, Agent, or Firm*—Kevin L. Daffer; Conley, Rose & Tayon

[57] ABSTRACT

An integrated circuit, a programming mechanism and a method are provided for programming manufacturing information upon non-volatile storage devices of the integrated circuit. The storage devices may be programmed after manufacture and prior to assembling the integrated circuit within a semiconductor package. Thereafter, the packaged circuit can be tested to determine where, how and when the integrated circuit was manufactured from among possibly numerous die within a wafer and wafer lot. The storage locations which receive manufacturing indicia are addressed in an address location entirely separate from the addresses which receive data during normal operation of the integrated circuit. Accordingly, manufacturing information is accessible by the manufacturer, and the customer is preferably made unaware of the address space employing those storage locations.

16 Claims, 4 Drawing Sheets

ELECTRICALLY IMPRINTING A SEMICONDUCTOR DIE WITH IDENTIFYING INFORMATION

BACKGROUND OF THE INVENTION

1. Field of the Invention

This invention relates to integrated circuit manufacture and, more particularly, to an apparatus and method for electrically programming indicia upon and retrieving indicia from an integrated circuit (i.e., "die") helpful, for example, in identifying that die from among numerous die within a wafer and/or wafer lot, and also identifying when the die was manufactured and at which fabrication facility it was manufactured.

2. Description of the Related Art

An integrated circuit is often referred to as a die or chip. Henceforth, those terms are henceforth interchangeably used. A die generally contains several thousand active and passive devices formed on a monolithic substrate. Those devices are generally interconnected to form an overall circuit. Active devices include transistors, whereas passive devices include resistors and capacitors, for example.

A monolithic substrate, often referred to as a semiconductor wafer, may contain several hundred die arranged across the wafer. After the active and passive devices are formed and selectively interconnected, each die is then tested both visually and electrically. The die which fail testing may then be marked with a visually detected "imprint". For example, a typical marking involves placing an ink or laser mark on non-viable die as the die are tested across each wafer. Die which are not marked with a visually detectable imprint, can then be separated from the wafer and thereafter used. The electrical testing procedure can be undertaken at several dissimilar temperatures, and possibly before and after stressing the die by exposing the die to temperature cycles.

Die which pass testing and are removed from the wafer may then be sealed or encapsulated within a semiconductor package. Leads extending from the package are electrically connected to bonding pads on the die internal to the package. The process of packaging good die is often referred to as "assembly". A conventional assembly operation may draw die from anywhere across a wafer, or from any wafer within a set of wafers or wafer lot. Assembly may also draw die from wafers among several wafer lots.

FIG. 1 illustrates a conventional assembly operation, whereby a packaged die 10 may be drawn from a first wafer 12 within lot 14. For example, package die 10 may be derived from die location 16 of wafer 12 within lot 14. Alternatively, die 10 can be drawn from location 18 within possibly the same lot 14 or, as shown, from another wafer 20 within another lot 22. Thus, FIG. 1 depicts multiple locations 16 and 18 from which an electrically viable die 10 can be extracted. Yet further, die 10 can also be obtained from either the first wafer or possibly another wafer 24 of yet a third lot 26. The location 28 from which die 10 is extracted can be the same as location 16 of lot 14 but from an altogether different wafer and/or possibly an altogether different lot.

Co-mingling good die from various locations of a single wafer, from several wafers, and from several wafer lots is what typically occurs during the assembly operation. Unfortunately, whenever die among multiple wafers and multiple lots are co-mingled, traceability as to that particular die is lost. If a packaged die later proves unreliable in the field, it would be beneficial from the viewpoint of the manufacturer to identify from where the packaged die was derived. It would also be desirable to determine how and when the packaged die was manufactured. Such indicia could aid the manufacturer in improving the manufacturing process not only after the packaged die is shipped, but also possibly during tests of the packaged product before shipment.

Conventional techniques used to identify die are primarily limited to pre-assembly. That is, typical identification methods rely upon visual markings placed on the die. Unfortunately, after the die is encapsulated within a package, the visual markings are obscured. Any failure analysis needed for an inoperable packaged product requires the package be opened and the die destroyed. It would be desirable to avoid using visual identification techniques for identifying die manufacturing information since identification and tracing of die should extend after assembly. The desirous technique of non-destructive identification proves especially useful in analyzing test skews on a viable die before and after assembly. Knowing the effect of assembly and/or usage in the field, and the effect of those operations on a unique die would prove valuable to an integrated circuit manufacturer.

SUMMARY OF THE INVENTION

The problems outlined above are in large part solved by an electrically programmable integrated circuit, die or chip. By design, the present die is programmed solely by the manufacturer without knowledge given to the customer. Thus, the programmable locations are within an address space which the customer will not access during normal operation of the die.

The storage locations are programmed at a time prior to the assembly operation. Preferably, programming occurs during electrical testing of the die within each wafer and for each wafer lot. A unique identifier is given to each die tested or which passes electrical testing, the identifier being indicia as to how the die was manufactured, where the die was manufactured, when the die was manufactured, and various other indicia traceable to die processing in general. After the die is assembled into a package, the programmed storage locations can then be electrically read by the manufacturer or by a customer of the manufacturer if properly instructed.

Reading the programmed storage locations or programmed bits involves addressing the address space reserved solely for receiving the manufacturing indicia Thus, the manufacturing indicia and, more specifically, the storage locations which contain the manufacturing indicia will not be called upon or accessed (read from or written to) during operation of the die. Thus, the address space which can contain the manufacturing information lies outside of address space used for integrated circuit operation. Thus, a customer which properly uses the present die will not be apprised of and therefore will not use the address space reserved for the present storage locations unless information as to the address space is provided by the manufacturer.

The storage locations are designed to be electrically programmed after the die is manufactured. However, once those locations are programmed, they are preferably non-volatile. That is, the present, non-volatile storage locations include, for example, programmable read only memory ("PROM"), fuses and/or anti-fuses, etc. Examples of popular PROMs, include EPROMs, EEPROMs or flash EPROMs. Accordingly, the integrated circuit having the fore-mentioned storage locations embodies an electrically programmable section used exclusively to monitor, e.g., product failure and/or electrical skews caused either by semiconductor fabrication, assembly, or in-the-field use.

Broadly speaking, the present invention concerns an integrated circuit. The integrated circuit comprises a non-volatile storage device formed in a first address location reserved solely for receiving information as to the manufacture of the integrated circuit. The first address location is preferably an address space outside of, or exclusive of, a second address location used for storing bits necessary to the operation of the integrated circuit. Information as to the manufacture of the integrated circuit is programmed possibly during tests on the integrated circuit prior to when the integrated circuit is encapsulated in a package. The information programmed into the first address location is electrically read after the integrated circuit is encapsulated (i.e., after assembly of the integrated circuit or die).

The present invention further concerns an apparatus for programming an integrated circuit. The apparatus comprises a programming mechanism adapted for addressing the storage location within the integrated circuit reserved for receiving manufacturing data exclusive of data called upon to operate the integrated circuit A mechanism is further provided to read the manufacturing data after the integrated circuit is placed within the integrated circuit package.

The present invention yet further concerns a method for verifying origination of an integrated circuit. The method comprises programming information identifying the manufacture of the integrated circuit into non-volatile storage locations outside an address range used by the integrated circuit during the operation. Thereafter, the integrated circuit embodying the programming information is packaged during an assembly operation. Programming the non-volatile storage locations used exclusive of integrated circuit operation involves addressing those locations and thereafter supplying bits thereto. The supplied bits may identify a wafer fabrication facility which manufactured the integrated circuit. The bits may also identify a year in which manufacture of the integrated circuit began. Yet further, the supplied bits may identify a week in which manufacture of the integrated circuit began. Still further, the supplied bits may identify a sequence number used to ascertain when a wafer manufacturing lot embodying the integrated circuit began.

BRIEF DESCRIPTION OF THE DRAWINGS

Other objects and advantages of the invention will become apparent upon reading the following detailed description and upon reference to the accompanying drawings in which.

Figure 1:
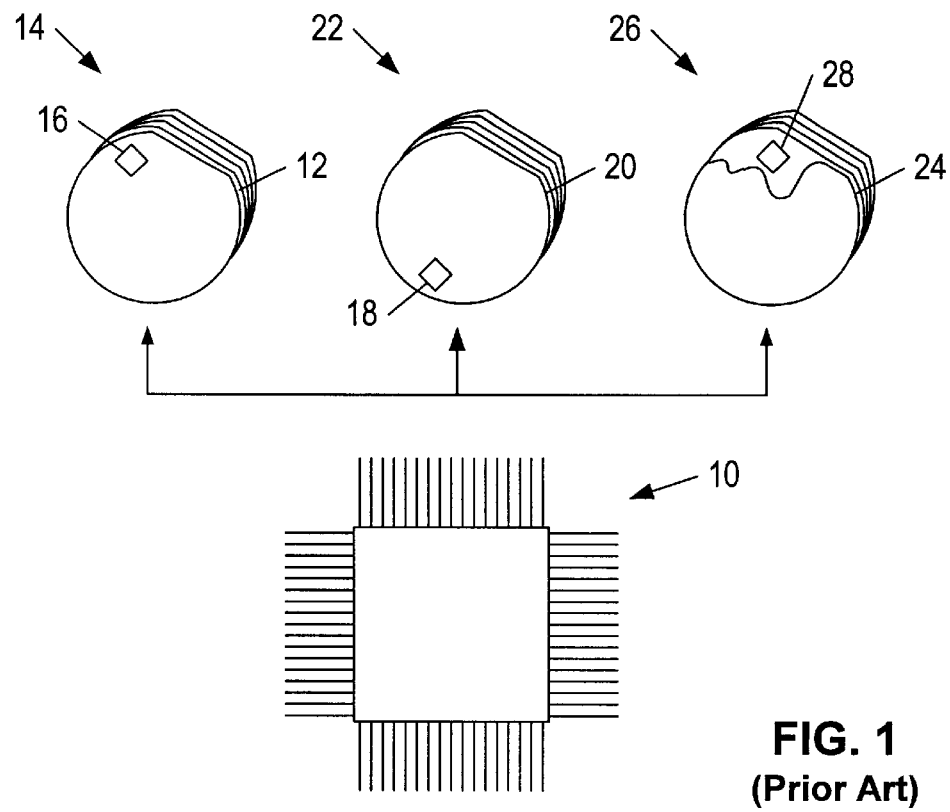
FIG. 1 illustrates wafers in various wafer lots from which numerous die are extracted and intermingled during a conventional assembly operation to produce a packaged integrated circuit.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
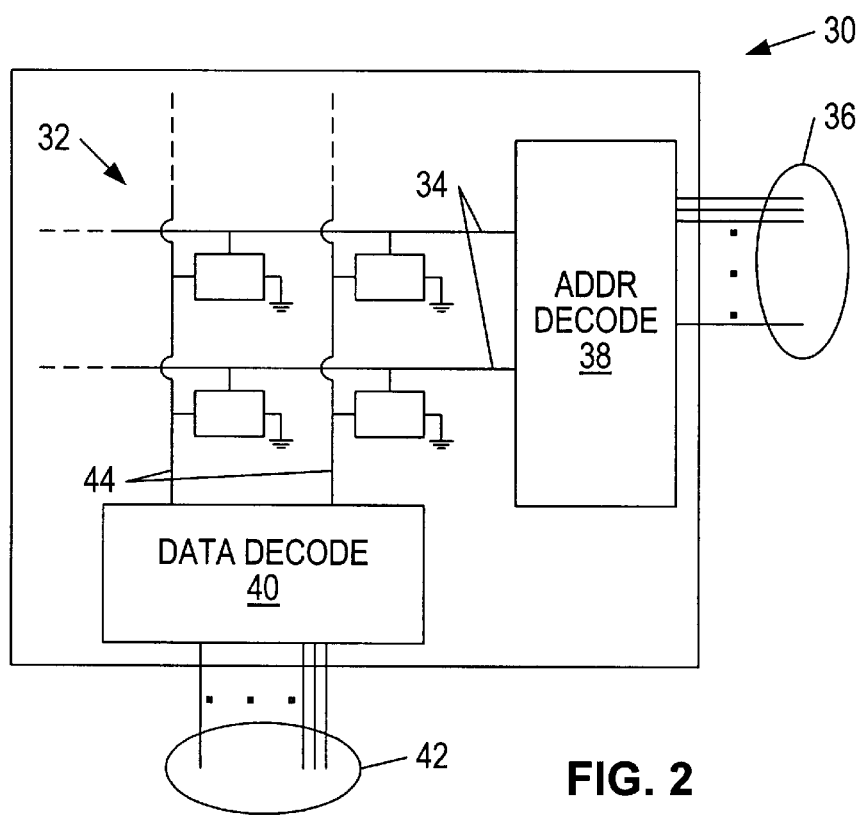
FIG. 2 is a plan view of a die comprising an apparatus for programming unique manufacturing indicia regarding the die upon storage devices arranged across the die.

Turning now to FIG. 2, an integrated circuit or die 30 is shown embodying one or more storage locations 32. Storage location 32 includes any non-volatile memory element addressable from word lines 34.

Word lines 34 arise from a decoded address dispatched upon address lines 36. An address decoder 38 receives encoded signals upon address lines 36 and produces a signal upon a unique word line 34 dependent on the binary number encoded on address lines 36. For example, an encoded value 110 is decoded by decoder 38 as a binary "1" value on the sixth word line.

Once a row is addressed (e.g., the sixth row is addressed), then a particular column within that row can be written to or read from via a data decoder 40. Decoder 40 receives data from a data bus 42, which can be the same as or different from address lines 36. If the data bus and address lines are shared, then address and data are time multiplexed on a mutual address/data bus of common architecture. Data bus 42 presents an encoded signal upon decoder 40, which then decodes that signal to a particular bit line 44 of multiple bit lines extending across storage location 32. The combination of a specific word line 34 with a specific bit line 44 allows a bit to be written to and read from a unique storage device within location 44. For example, a suitable storage device includes a PROM (implemented as a PROM, an EPROM, an EEPROM or as a flash memory cell), a fuse or an anti-fuse.

Integrated circuit 30 is shown having various circuits and/or subsystems arranged upon a monolithic substrate which also includes a uniquely addressed storage device within storage location 32. Thus, storage locations 32 are produced during manufacture of integrated circuit 30, but are not programmed until after manufacture and preferably before assembly. The number of bit lines 44 and word lines 34 will vary upon depending on the amount of manufacturing indicia needed to be stored. Accordingly, storage location 32 can be of pre-defined size at manufacture, yet a variable portion of address location 32 is used depending on the amount of information needing to be stored.

Figure 3:
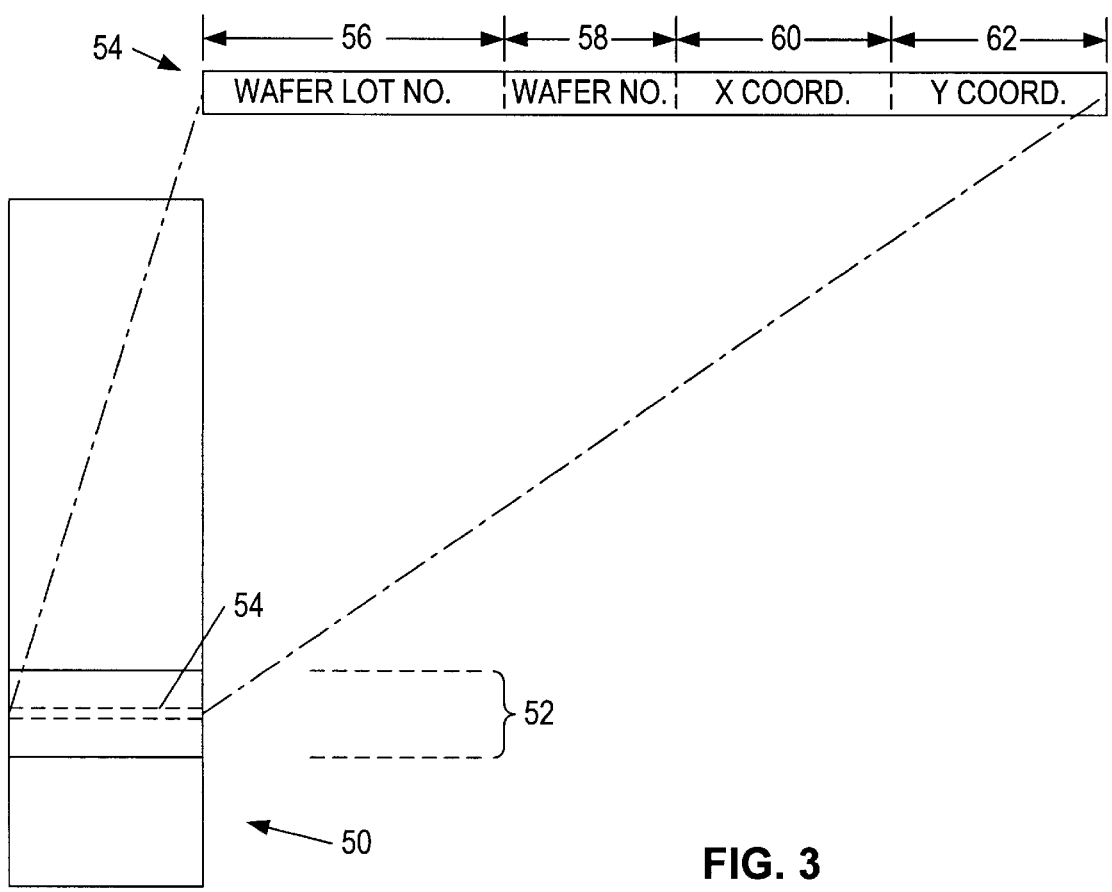
FIG. 3 is a plan view of a memory address space embodying an address location reserved for receiving the manufacturing indicia comprising, e.g., wafer lot number, wafer number within the identified lot, x coordinate of the identified die, and y coordinate of the identified die.

Some of the information which can be stored within location 32 of FIG. 2 is shown in FIG. 3. According to one embodiment, an address decoder used to address the entire programmable storage locations of the integrated circuit can accommodate an address space 50. A majority of address space 50 is used to program operation of the integrated circuit, or other integrated circuits operably linked thereto. However, a subset 52 of address space 50 is reserved for receiving manufacturing indicia Subset 52 can be found as possibly a contiguous space or bifurcated into multiple address locations within address space 50. Subset address space 52 can be of fixed size for a particular integrated circuit post-manufacture, or can be variable in size depending on the number of address locations desired. For example, at least one address location 54 within space 52 may be used to uniquely identify a die particular to data stored at location 54. For example, identifying information attributed to that die includes a wafer lot number 56 from which the die was extracted. The identifying information may also include the particular wafer number 58 within that lot containing the die. It may also be beneficial to note the position upon the wafer 58 which contained the extracted die. Thus, the electrically viable die may be drawn from a particular location denoted according to an X coordinate 60 and a Y coordinate 62. The X and Y coordinate comprise a grid which will be described below.

Figure 4:
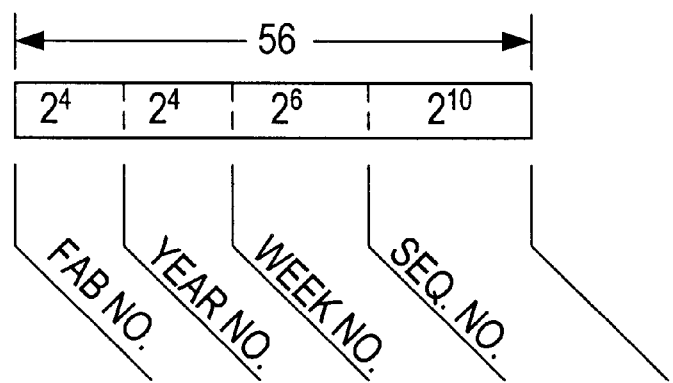
FIG. 4 is a sequence of bits used to identify information as to the wafer lot number.

Turning to both FIGS. 3 and 4 and shown merely as an example, wafer lot number 56 or the die extracted from wafer lot number 56 can be identified according to the fabrication facility (i.e., "FAB NO.") which produced the wafer lot number and possibly the year ("YEAR NO.") and work week ("WEEK NO") in which the wafer lot number was begun. For example, a manufacturer may have numerous fabrication facilities which can be addressed with numerous bits on the address line (e.g., four bits would indicate up to ten fabrication facilities). The year and work week from which the wafer lot was initiated can also be represented from 0 through 9 as the year and from 0 to 52 as the work week, each represented by 4 and 6 address bits, respectively. Wafer lot 56 can also be identified according to a sequence of lot numbers beginning with 0 and ending with a pre-defined number. For example, there may be a sequence ranging from 0 to 999, whereby 10 bits can be used to encode a unique lot number within the sequence range. Given the above example, wafer lot number 56 can be uniquely identified with 10+6+4+4 or 24 bits decoded from the address line onto a unique storage location.

FIG. 3 also illustrates identification of a particular wafer number 58. According to one example, a wafer lot may contain possibly 24 wafers, such that wafer number indicia 58 may contain 5 bits which, when decoded, select a particular wafer within the wafer lot. X and Y coordinates can also be identified for a given wafer uniquely determined from wafer number 56.

Figure 5:
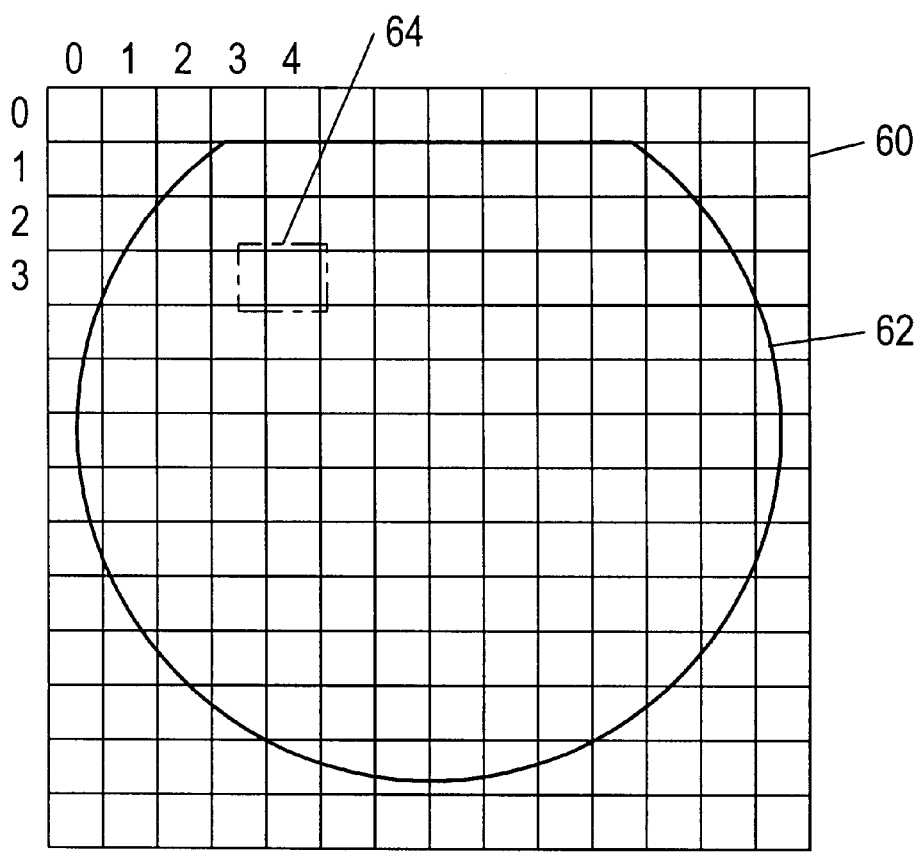
FIG. 5 is a grid of x and y coordinates used to identify where, within a particular wafer, a die is derived.

Referring to FIG. 5, a grid system 60 is shown drawn across a wafer 62. Location at which a die is extracted from wafer 62 can be determined based on where that die falls within grid 60. If the majority of the die falls within a specific X and Y coordinate, then that coordinate location is recorded during, e.g., a "wafer mapping" operation and the mapped information provided to program the storage locations dedicated to receive X coordinate and Y coordinate 60 and 62 information, shown in FIG. 3. Merely as an example, the majority of die 64 is shown to exist at X coordinate four and Y coordinate three. The X and Y coordinates are logged by the manufacturer and thereafter encoded and dispatched to the address decoder, which then loads the appropriate device within storage location 32 (shown in FIG. 2). Die 64 is shown in FIG. 5 larger than a coordinate boundary. However, it is understood that the die may be smaller than a coordinate boundary and therefore the grid resolution can be varied depending on, for example, the die lateral extents.

Keeping track of where a die is extracted from a particular wafer, and where that wafer is in relation to a wafer lot are but examples of the benefits in recording any and all manufacturing information pertinent to a unique die. The mechanism used to record manufacturing information and thereafter read that information is best illustrated in reference to FIG. 6.

Figure 6:
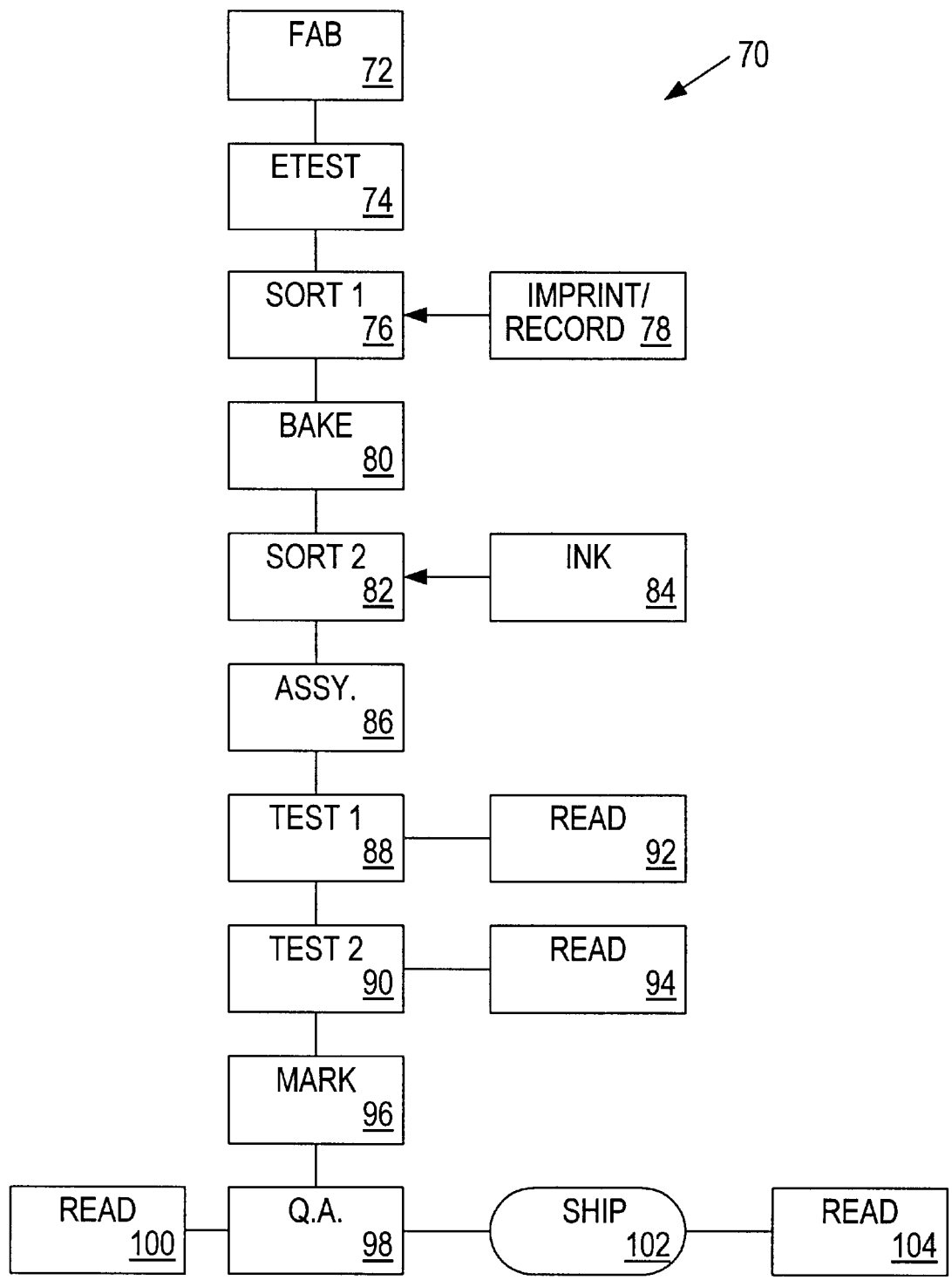
FIG. 6 is flow diagram of operations used to test and assemble die prior to shipment to a customer, wherein the manufacturing indicia can be electrically programed during an early test operation in readiness for the indicia being read either before or after shipment of the packaged die.

FIG. 6 illustrates a processing flow 70 undertaken by a manufacturer of an integrated circuit. Flow 70 begins by fabricating a wafer 72 containing a plurality of die. Engineering tests 74 can be conducted on test devices at select locations across one or more wafers within a wafer lot. Provided the engineering tests 74 roughly indicate positive results, then each die of every wafer can then be tested 76 at SORT1. SORT1 can include parametric and functional testing, as well as visual inspection. Electrical testing includes probing the bond pads of each die to ascertain whether that die meets a limited number of performance points. During SORT1, storage locations, which are not called upon during normal operation, may be programmed during an imprint step 78. Programming the storage locations requires accessing subset 52 of the entire address space 50 (shown in FIG. 3). Once the non-volatile memory elements are programmed, then each wafer may be subjected to a high thermal cycle, generally referred to as the bake cycle 80. Each die can thereafter be subjected to another sort test 82, referred to as SORT2. SORT2 may contain many tests which are substantially identical to those used at SORT1. All die which fail SORT2 test 82 are marked with a visually-identifiable marking, such as an ink dot 84. Die which are electrically and visually viable are then passed to an assembly operation 86.

Assembly 86 involves placing die which pass die-probe test (SORT1 and SORT2) into a package and then sealing that package using various well-known techniques. Connection between the bond pads upon the viable die to leads extending from the package occur during assembly operation 86.

Testing the assembled product may involve testing at various temperatures. For example, TEST1 procedure 88 may be performed at cold temperatures, and TEST2 procedure 90 may involve testing at hot temperatures. The temperatures used at test procedure 88 and 90 can vary depending upon manufacturer specification, and/or customer demands. Possibly during each test, the storage locations programmed during step 78 can be read at steps 92 and 94. For example, a unique die programmed with manufacturing indicia at step 78 can be traced to test procedure 88 and read at step 92. Any skew in the operational characteristics of that die can be monitored. The importance in providing specific details of how, when and where a die arises can be mimicked after assembly to correlate test parameters back to that die at both high and low temperatures.

As but one example, test skews may occur depending on where a die is manufactured relative to the radial edges or center of a wafer. If, for example, contaminants predominantly occur near the edge of a wafer due possibly to accumulation upon the processing chamber wall, then those contaminants may only surface if tests are performed at elevated temperatures. TEST2 procedure 90 and reading 94 where a die is processed within a wafer proves beneficial in identifying the chamber wall as the cause for yield loss or reliability problems.

Once the assembled die is tested, the packaged product can then be marked with customer and/or vendor identification at step 96. Thereafter, the packaged product can be finally tested at a quality assurance step 98. Qualification test 98 may involve an additional reading of the programmed or "imprinted" manufacturing indicia at step 100. That which passes the qualification test 98 can then be shipped to a customer at step 102. Should the customer have problems, or if the manufacturer periodically requests in-field testing, manufacturing indicia can be read at step 104.

Shown in FIG. 6 are multiple opportunities in which to read manufacturing information electrically imprinted to an address space generally not called upon by a customer. In fact, it is desirous that a customer not have knowledge of this address space, and that the address space be used solely by the manufacturer to provide traceability of packaged product to a particular wafer lot, wafer number and/or die location.

It will be appreciated to those skilled in the art having the benefit of this disclosure that this invention is believed applicable to any integrated circuit which can embody non-volatile programmable storage locations. It is understood that the form of the invention shown is to be taken as exemplary, presently preferred embodiments. Regardless of how the integrated circuit is processed or assembled, the present invention is suited for identifying a die from among numerous die and for tracing that die to a packaged die before and after leaving the manufacturer's site. Accordingly, the specification and drawings are to be regarded in an illustrative rather than a restrictive sense as to possibly numerous variations which fall within the spirit and scope of the present invention.

What is claimed is:

1. An integrated circuit, comprising a non-volatile storage device formed in a first address location reserved for receiving information as to the manufacture of the integrated circuit, wherein said first address location is inaccessible during normal operation of the integrated circuit.

2. The integrated circuit as recited in claim 1, wherein said information as to the manufacture of the integrated circuit is written into said first address location during test of the integrated circuit prior to encapsulating the integrated circuit, and wherein the programmed information is electrically readable after the integrated circuit is encapsulated.

3. The integrated circuit as recited in claim 2, wherein the programmed information is electrically readable by one other than a programmer of the integrated circuit.

4. The integrated circuit as recited in claim 1, wherein said information as to the manufacture of the integrated circuit comprises x and y coordinate locations of a die comprising the integrated circuit.

5. The integrated circuit as recited in claim 4, wherein said information as to the manufacture of the integrated circuit comprises a wafer number within a wafer lot comprising said wafer.

6. The integrated circuit as recited in claim 1, wherein said information as to the manufacture of the integrated circuit comprises a lot number identified from among a plurality of lot numbers by: (i) a wafer fabrication facility which manufactured the identified lot number, (ii) a year in which the lot number was started, (iii) a week in which the lot number was started, and (iv) a sequence number attributed to the identified lot number between zero and a pre-defined number.

7. An apparatus for programming an integrated circuit, comprising:

a programming mechanism adapted for addressing a storage location within the integrated circuit reserved for receiving manufacturing data exclusive of data called upon to operate the integrated circuit, wherein the storage location is inaccessible during normal operation of the integrated circuit; and a read mechanism adapted to read the manufacturing data after the integrated circuit is placed within an integrated circuit package.

8. The apparatus as recited in claim 7, wherein said programming mechanism places the manufacturing data into the storage location prior to encapsulating the integrated circuit in a package.

9. The apparatus as recited in claim 7, wherein said manufacturing data comprises a location in a semiconductor wafer from which the integrated circuit is derived.

10. The apparatus as recited in claim 9, wherein said manufacturing data comprises a semiconductor wafer lot number from which the semiconductor wafer is derived.

11. The apparatus as recited in claim 7, wherein said manufacturing data comprises a semiconductor wafer lot number identified from among a plurality of lot numbers by (i) a wafer fabrication facility which manufactured the identified lot number, (ii) a year in which the identified lot number was started, (iii) a week in which the identified lot number was started, and (iv) a sequence number attributed to the identified lot number between zero and a pre-defined number.

12. The apparatus as recited in claim 7, wherein said programming mechanism comprises a signal generator operably coupled to a plurality of address and data lines, the number of which is defined by a number of encoded bits representing a wafer lot number, a wafer number, and a coordinate location upon a wafer from which the integrated circuit is derived.

13. The apparatus as recited in claim 7, wherein the storage location is not accessed during normal operation of the integrated circuit.

14. A method for indicating origination of an integrated circuit, comprising:

programming information identifying the manufacture of the integrated circuit into non-volatile storage locations outside an address range used by the integrated circuit during its operation;

packaging the integrated circuit;

shipping the integrated circuit to a customer after said packaging; and retrieving the programmed information, after said shipping.

15. The method as recited in claim 14, further comprising additionally retrieving the programmed information prior to said packaging.

16. The method as recited in claim 14, wherein said programming comprises:

addressing the non-volatile storage locations;

supplying bits to the addressed storage locations for:
identifying a wafer fabrication facility which manufactured the integrated circuit;
identifying a year in which manufacture of the integrated circuit began;
identifying a week in which manufacture of the integrated circuit began; and
identifying a sequence number used to identify when a wafer manufacturing lot embodying the integrated circuit began.

* * * * *